United States Patent
Kadota et al.

(10) Patent No.: US 9,357,685 B2
(45) Date of Patent: May 31, 2016

(54) COMPONENT MOUNTING APPARATUS

(75) Inventors: Syozo Kadota, Yamanashi (JP); Akira Yamada, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 408 days.

(21) Appl. No.: 13/990,810

(22) PCT Filed: Sep. 11, 2012

(86) PCT No.: PCT/JP2012/005764
§ 371 (c)(1),
(2), (4) Date: Jun. 25, 2013

(87) PCT Pub. No.: WO2013/069182
PCT Pub. Date: May 16, 2013

(65) Prior Publication Data
US 2014/0068928 A1   Mar. 13, 2014

(30) Foreign Application Priority Data

Nov. 8, 2011   (JP) .................................. 2011-244231

(51) Int. Cl.
*B23P 19/00* (2006.01)
*H05K 13/04* (2006.01)
*H01L 23/00* (2006.01)

(52) U.S. Cl.
CPC .............. *H05K 13/04* (2013.01); *H01L 24/75* (2013.01); *H05K 13/0408* (2013.01); *Y10T 29/53174* (2015.01)

(58) Field of Classification Search
CPC .... H05K 13/0408; H05K 13/04; H01L 24/75; Y10T 29/53174; Y10T 29/53178; Y10T 29/53191; Y10T 29/5313; Y10T 29/53
USPC .......................... 29/739, 740, 743, 729, 700
See application file for complete search history.

(56) References Cited

U.S. PATENT DOCUMENTS

| 6,193,136 B1 | 2/2001 | Higashi et al. |
| 2001/0001469 A1 | 5/2001 | Higashi et al. |

(Continued)

FOREIGN PATENT DOCUMENTS

| CN | 1228673 A | 9/1999 |
| JP | 2000-68327 A | 3/2000 |

(Continued)

OTHER PUBLICATIONS

International Search Report for PCT/JP2012/005764 dated Dec. 11, 2012.

(Continued)

*Primary Examiner* — Peter DungBa Vo
*Assistant Examiner* — Azm Parvez
(74) *Attorney, Agent, or Firm* — Pearne & Gordon LLP

(57) ABSTRACT

A inverting head 20 that inverts a component 4 picked up by a nozzle 20a upside down includes a flat-plate-like base 31 provided on a vertically-movable transfer base 21d; a nozzle holder support member 33 that is swayable within a horizontal plane the base as a result of arcuate peripheries 41 being supported by a plurality of bearings 32 provided on the base 31; and a nozzle holder 34 that is supported so as to be turnable around a horizontal axis CX by the nozzle holder support member 33 and that holds on its side surface the nozzle 20a.

2 Claims, 10 Drawing Sheets

(56) References Cited

U.S. PATENT DOCUMENTS

| | | |
|---|---|---|
| 2002/0069524 A1 | 6/2002 | Kawashima |
| 2006/0104754 A1 | 5/2006 | Narita et al. |
| 2008/0141526 A1 | 6/2008 | Narita et al. |

FOREIGN PATENT DOCUMENTS

| | | | |
|---|---|---|---|
| JP | 2001-156497 A | | 6/2001 |
| JP | 2001156497 A | * | 6/2001 |
| JP | 2001-210994 A | | 8/2001 |
| JP | 2005-347321 A | | 12/2005 |
| JP | 2005347321 A | * | 12/2005 |
| WO | 2004/051731 A1 | | 6/2004 |

OTHER PUBLICATIONS

Office Action for Chinese Application No. 201280004453.0, Dated Aug. 31, 2015.

* cited by examiner

COMPONENT MOUNTING APPARATUS

TECHNICAL FIELD

The present invention relates to a component mounting apparatus that receives with a mount head a component inverted or inverted) upside down by a inverting head, mounting the thus-received component on a substrate.

BACKGROUND ART

Some of component mounting apparatus that mount component on a substrate with a mount head are configured such that the mount head receives a component which is inverted upside down by a inverting head and mounts the thus-received component on a substrate. A liquid crystal panel manufacturing apparatus known as such, for instance, mounts a component, like a drive circuit, on a peripheral region of a liquid crystal panel. An inverting head provided in such a component mounting apparatus is usually equipped with a nozzle attached to a lower end of a shaft-like, vertically-elongated member. Further, a mechanism that vertically moves and sways around a vertical axis of the shaft-like member to which the nozzle is attached is mounted around the shaft-like member so that a component picked up by the nozzle can be vertically moved and swung around the vertical axis (see; for instance, Patent Document 1).

The some of component mounting apparatus are of the type in which the mount head is spatially fixed in order to eliminate a positioning error which would occur during movement of the mount head, a substrate is moved such that an electrode on the substrate which will act as a component mounting targeting location, is situated below the spatially-fixed mount head, an inverting head is moved such that a component inverted upside down comes to an elevated position above the component mounting targeting location (i.e., a position beneath the mount head). In the case of the component mounting apparatus of this type, the inverting head enters a space between the substrate and the mount head, passing to the mount head the component inverted upside down. The mount head received the component lowers the component after the inverting head has left the elevated position above the component mounting targeting location, mounting the thus-lowered component to the component mounting targeting location.

RELATED ART DOCUMENT

Patent Document

Patent Document 1: JP-A-2000-68327

SUMMARY OF THE PRESENT INVENTION

Problem that the Present Invention is to Solve

However, in the above-configured component mounting apparatus, in order for the inverting head to be able to position a component inverted upside down to an elevated position above the component mounting targeting location on the substrate (i.e., a position below the mount head) without interfering with both the substrate and the mount head, a distance between the substrate and the mount head must be set to a large value that is greater not only than a dimension of the nozzle of the inverting head but also than a dimension of the entire inverting head including the shaft-shaped member to which the nozzle is attached and the mechanism for vertically moving and rotating the shaft-shaped member. A downstroke of the component required during component mounting operation becomes correspondingly longer, which incurs an increase in size of the overall apparatus and might deteriorate accuracy in mounting component.

Accordingly, the present invention aims at providing a component mounting apparatus which makes short a downstroke of a component required when a mount head mounts the component on a substrate, to thus make an overall apparatus compact, and which can enhance an accuracy in mounting the component.

Means for Solving the Problem

A component mounting apparatus of the present invention comprises a substrate positioning section positioning a substrate; an inverting head that picks up a component fed to a component supplying position from above by a nozzle, that inverts the component upside down, and that transfers the component inverted upside down to a position that is above a component mounting targeting location on the substrate positioned by the substrate positioning section; and a mount head that receives the component transferred to the position above the component mounting targeting location from the inverting head, and that lowers the component after the inverting head left, the position above the component mounting targeting location, so as to mount the component to the component mounting targeting location; wherein the inverting head includes a flat-plate-like base provided on a vertically-movable transfer member; a nozzle holder support member including an arcuate periphery supported by a plurality of bearings provided on the base and that is swayable within a horizontal plane with respect to the base; a nozzle holder that extends in a horizontal direction with both ends of the nozzle holder being supported by the nozzle holder support member, that is turnable around a horizontal axis, and that holds the nozzle on a side surface of the nozzle holder; a rotary driving section that turns the nozzle holder around the horizontal axis, so as to switch an orientation of the nozzle between up and down; and a sway driving section that sways the nozzle holder support member within the horizontal plane with respect to the base, so as to change the orientation of the upwardly/downwardly-oriented nozzle within the horizontal plane.

The component mounting apparatus of the present invention is the previously-mentioned component mounting apparatus, wherein the nozzle holder includes a nozzle base that is at both ends thereof supported by the nozzle holder support member, that extends in the horizontal direction, and that has a vacuum pathway formed in the nozzle base; a nozzle engagement member that brings the vacuum pathway in the nozzle and the vacuum pathway in the nozzle base into mutual communication with each other by engaging the nozzle on the side surface of the nozzle base; and a pair of fixing members that are slidably attached to both ends of the nozzle base from outside, to thus fix the nozzle engagement member to the nozzle base.

Advantage of the Present Invention

In the present invention, the inverting head that inverts a component picked up by the nozzle upside down is made up of the flat-plate-like base provided in the transfer base that is a vertically movable member, the nozzle holder support member capable of swaying within the horizontal plane as a result of the plurality of bearings provided on the base supporting the arcuate peripheries, and the nozzle holder that is supported by the nozzle holder support member so as to be turnable around the horizontal axis and that holds on its side surface the nozzle. Since neither the mechanism for vertically moving the nozzle holder nor the mechanism for swaying the nozzle holder around the vertical axis is present in the regions above and below the nozzle holder, the regions above and below the nozzle holder can be made open. Consequently, the distance between the substrate and the mount head required for the inverting head to avoid interfering with the substrate and the mount head when the component inverted upside down is moved to an elevated position above the component mounting targeting location on the substrate can be set to a small value. The down-stroke of the component required when the mount head mounts the component to the substrate is thereby made short, making the entire component mounting apparatus compact and enhancing accuracy in mounting the component.

EMBODIMENT FOR IMPLEMENTING THE PRESENT INVENTION

Figure 1:
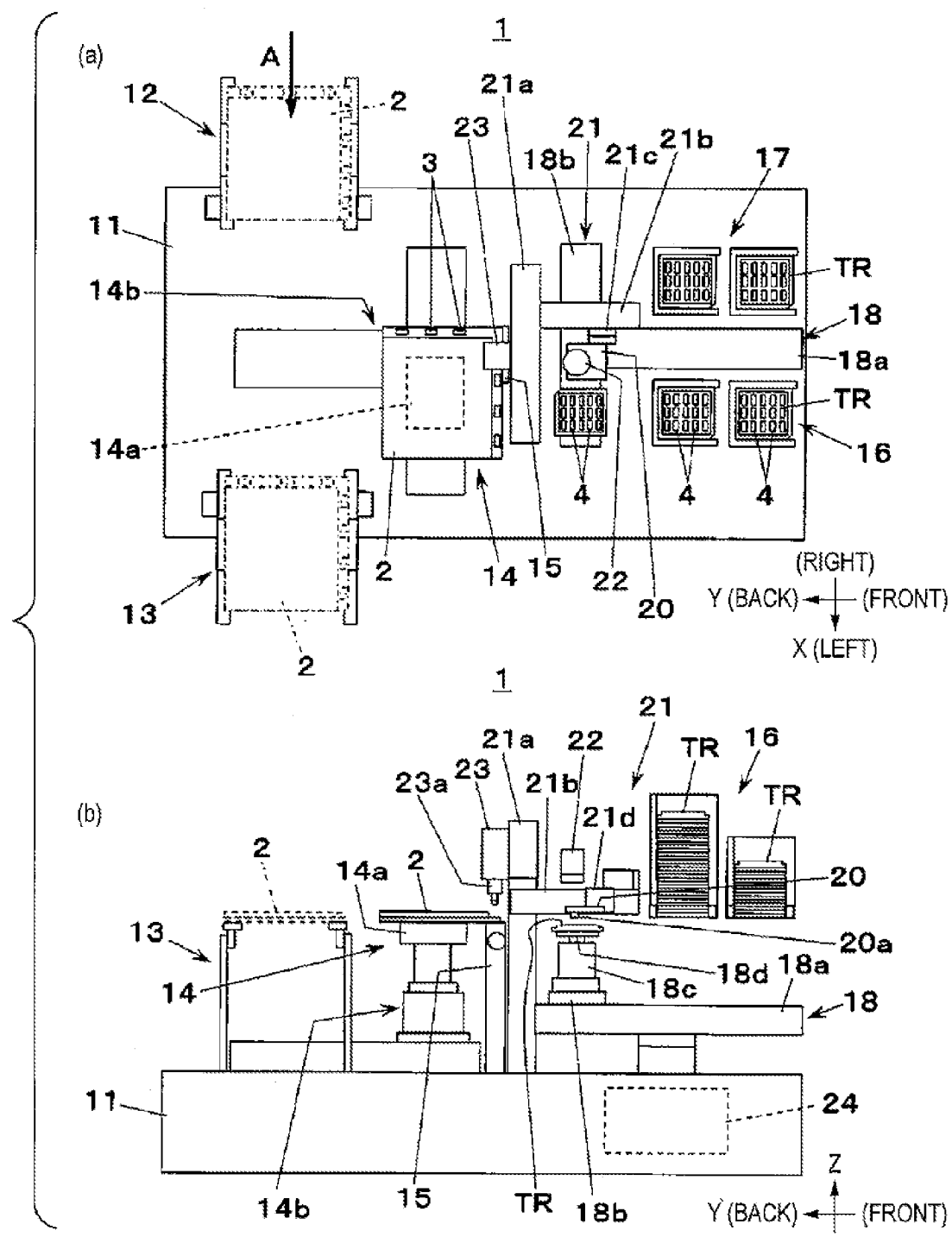
FIG. 1 is view in which (a) shows a plan view of a component mounting apparatus of an embodiment of the present invention, and (b) shows a side view of the same.

An embodiment of the present invention is hereunder described by reference to the drawings. A component mounting apparatus 1 shown in (a) and (b) in FIG. 1 is one that iterates component mounting operations: that is, receiving a substrate 2 delivered from another apparatus which is, on an upstream side with respect to a process flow, contiguous to the component mounting apparatus 1, positioning the thus-received substrate 2, mounting component 4 on respective electrodes 3 aligned along each of edges of the substrate 2, and delivering the substrate 2 to another apparatus which is, on a downstream side with respect to the process flow, contiguous to the component mounting apparatus 1. Disposed on a bench 11 are a substrate carry-in section 1, a substrate carry-out section 13, a substrate positioning section 14, a backup stage 15, a tray feed section 16, a tray recovery section 17, a tray transfer mechanism 18, a inverting head 20, a inverting head transfer mechanism 21, a recognition camera 22, a mount head 23, and a control unit 24. For simplicity of explanation, a direction of transfer of the substrate 2 (designated by arrow A in (a) in FIG. 1) is taken as an X-axis direction; a direction of a horizontal plane that is orthogonal to the X-axis direction is taken as a Y-axis direction; and a vertical direction is taken as a Z-axis direction. Moreover, provided that the Y-axis direction is taken as a front-back direction, one side (a right side of FIG. 1), with respect to the front-back direction, where an un-illustrated operator performs work is taken as the front, whilst the other side (a left side of (a) and (b) in FIG. 1) with respect to the front-back direction is taken as the back. Furthermore, one side (a right side when viewed from the operator and an upside in (a) in FIG. 1), with respect to the X-axis direction taken as a right-left direction, where the upstream process apparatus is disposed is taken as the right, whereas the other side (a left side when viewed from the operator and a lower side in (a) in FIG. 1) where the downstream process apparatus is disposed is taken as the left.

In (a) in FIG. 1, each of the substrate carry-in section 12 and the substrate carry-out section 13 is made up of a conveyor mechanism that extends along the X-axis direction, and they are disposed opposite along the X-axis direction in a rear region on the bench 11. In the embodiment, the substrate carry-in section 12 is disposed at a right end of the bench 11, whilst the substrate carry-out section 13 is disposed at a left end of the bench 11.

The substrate positioning section 14 is placed in a region on the bench 11 between the substrate carry-in section 12 and the substrate-carry out section 13 and made up of a substrate hold table 14a that holds the substrate 2 and a substrate hold table actuating section 14b that horizontally and vertically moves the substrate hold table 14a that holds the substrate 2. The backup stage 15 is placed in a forward region on the bench 11, which is in front of the substrate positioning section 14, so as to extend in the X-axis direction.

The substrate positioning section 14 transfers the substrate hold table 14a that holds the substrate 2, by means of the substrate hold table actuating section 14b, transferring and positioning the substrate 2. An orientation of the substrate 2 is adjusted at this time such that the row of electrodes 3 which are component mounting targeting locations set along an edge of the substrate 2 comes into alignment with the X-axis direction, and the row of electrodes 3 is then positioned above the backup stage 15.

As shown in (a) in FIG. 1, in the embodiment, a plurality of rows of electrodes 3 are aligned along one long edge of the substrate 2, and a plurality of rows of electrodes 3 are also aligned along one short edge of the substrate 2. Therefore, the substrate positioning section 14 operates so as to position the substrate 2 such that the rows of the electrodes 3 aligned along the edge of one long side of the substrate 2 are situated at an elevated position above the backup stage 15. After mounting the component 4 along the long side is practiced, the substrate positioning section 14 also operates so as to position the substrate 2 by turning the substrate hold table 14a through 90 degrees in such a way that the rows of the electrodes 3 aligned along the edge of one short side of the substrate 2 are situated at an elevated position above the backup stage 15.

In (a) and (b) in FIG. 1, each of the tray feed section 16 and the tray recovery section 17 is made up of a plurality of tray storage cabinets. Each of the tray storage cabinets can store a plurality of trays TR while stacking them on top of each other in layers and also take in and out the tray TR from below. The trays TR housing the component 4 (the trays from which the component 4 is not yet taken out) are stored in the tray feed section 16. The trays TR emptied of the component 4 (from which the component 4 have already been taken out) are stored in the tray recovery section 17.

In (a) and (b) in FIG. 1, the tray transfer mechanism 18 is made up of a Y-axis table 18a that is placed in a forward region of the bench 11 so as to extend along the Y-axis direction; an X-axis table 18b that extends in the X-axis direction and that travels over the Y-axis table 18a in the Y-axis direction, a Z-axis table 18c that travels over the X-axis table 18b in the X-axis direction and whose top panel is vertically movable, and a tray support 18d attached to the top panel of the Z-axis table 18c. The tray support 18d has an un-illustrated tray grip mechanism for the purpose of taking a tray TR out from the tray feed section 16 and storing the tray TR into the tray recovery section 17. By combination of transfer of the X-axis table 18b with respect to the Y-axis table 18a, transfer of the Z-axis table 18c with respect to the X-axis table 18b, and vertical transfer of the top panel of the Z-axis table 18c, the tray transfer mechanism 18 performs operation for three-dimensionally transferring the tray support 18d, taking a tray TR out of the tray feed section 16 from below, and transferring the thus-taken tray TR to a predetermined component supplying position (a position in (b) in FIG. 1 where the inverting head 20 to be described alter picks up the component 4 by suction) (operation for feeding the component 4) and operation for storing into the tray recovery section 17 an empty tray TR from which the inverting head 20 has finished taking out the component 4 at the component supplying position.

The inverting head 20 picks up the component 4 from the inside of the tray TR, which is situated at the component supplying position by the tray transfer mechanism 18, by means of a nozzle 20a and subsequently switches an orientation of the nozzle 20a between up and down, thereby inverting the component 4 upside down. The inverting head 20 can sway the upwardly/downwardly-oriented nozzle 20a within a horizontal plane and align the orientation of the component 4 inverted upside down within the horizontal plane (details will be described later).

A gantry-shaped stage 21a which extends in the X-axis direction is placed at a center of the bench 11. The inverting head transfer mechanism 21 is made up of a Y stage 21b that extends in the Y-axis direction and is capable of transferring along the X-axis direction below the gantry-shaped stage 21a, a Z stage 21c that extends in the Z-axis direction and is transferrable in the Y-axis direction over the Y stage 21b, and a transfer base 21d provided so as to be vertically movable along the Z stage 21c. The inverting head 20 is attached to the transfer base 21d. The inverting head transfer mechanism 21 transfers the inverting head 20 by combination of transfer of the Z stage 21c in the Y-axis direction with vertical movement of the transfer base 21d with respect to the Z stage 21b.

An imaging field of the recognition camera 22 is oriented downwards, and the recognition camera 22 is positioned such that an imaging optical axis runs through the component supplying position. The recognition camera 22 captures from above an image of the component 4 situated at the component supplying position or an image of the component 4 which has been picked up from the component supplying position and inverted top to bottom by the inverting head 20.

The mount head 23 is secured to the gantry-shaped stage 21a (therefore the mount head is spatially secured) at an elevated position above the backup stage 15. The mount head 23 has a nozzle-shaped, downwardly-extended component mount section 23a in a vertically movable manner. The component 4 that is inverted top to bottom by the inverting head 20 and that is received by the component mount section 23a is attached to the electrode 3 of the substrate 2 on the backup stage 15 by means of descending action of the component mount section 23a. The mount head 23 is fixed to an elevated position above the backup stage 15. Therefore, a point where the component 4 is mounted substantially matches the lowest point of a downward stroke of the component mount section 23a provided on the mount head 23.

On occasion of handing or receiving the component 4 inverted upside down to or from the mount head 23, the inverting head 20 is moved from a position in front of the mount head 23 in a horizontal direction (in a backward direction) so as to enter a region between the substrate 2 positioned by the substrate positioning section 14 and the mount head 23.

A configuration of the inverting head 20 belonging to the component mounting apparatus 1 is now described. As shown in (a), (b) and (c) in FIG. 2, the inverting head 20 includes a flat-plate-like base 31 that is provided so as to laterally jut out of the transfer base 21d which is vertically movable in the inverting head transfer mechanism 21; a plurality of bearings 32 provided on an underside of the base 31; a nozzle holder support member 33 whose outer circumference is partially supported by the plurality of bearings 32 and that is swayable within the horizontal plane below the base 31; and a nozzle holder 34 whose both ends are supported by the nozzle holder support member 33, that extends in the horizontal direction, that is turnable around a horizontal axis CX, and that holds on one side the nozzle 20a.

Figure 3:
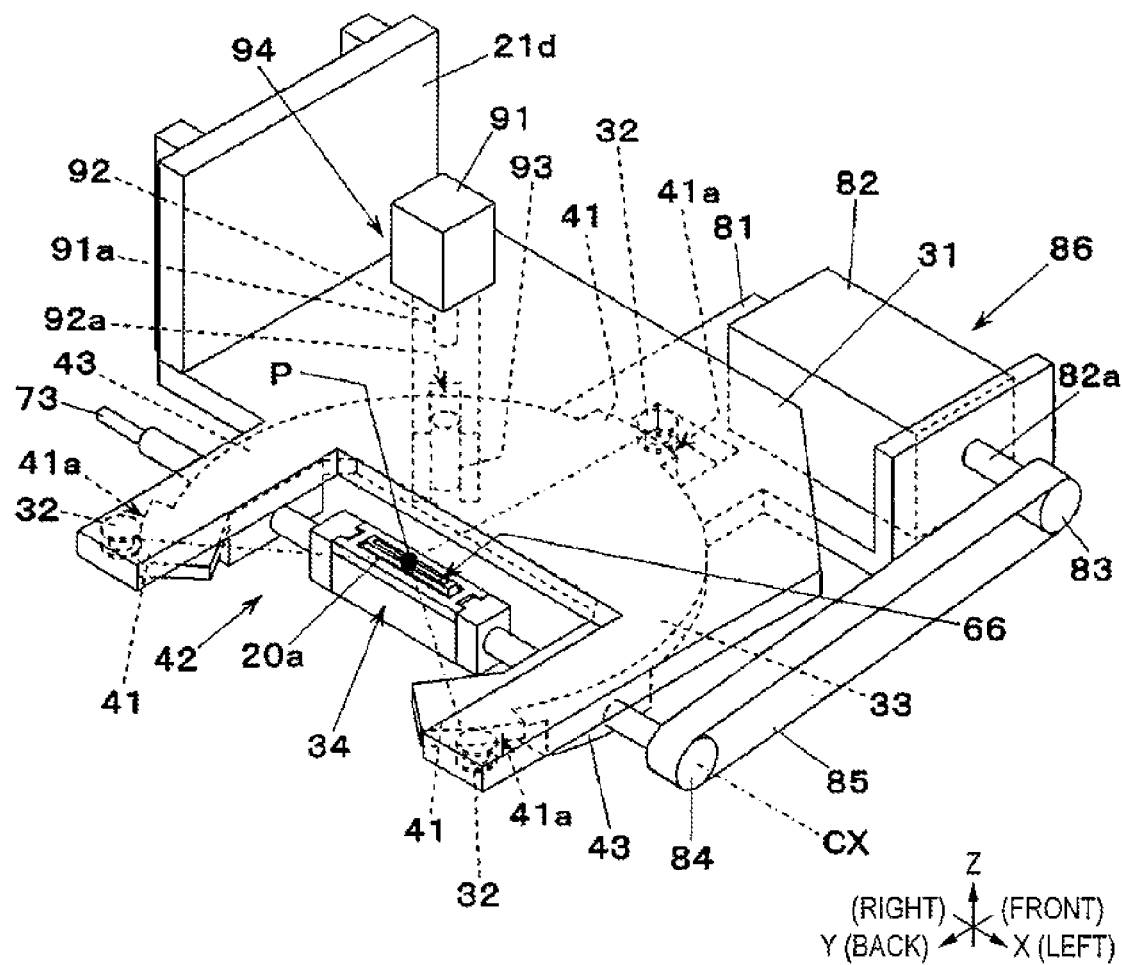
FIG. 3 is a perspective view of the inverting head provided in the component mounting apparatus of the embodiment of the present invention.
Figure 4:
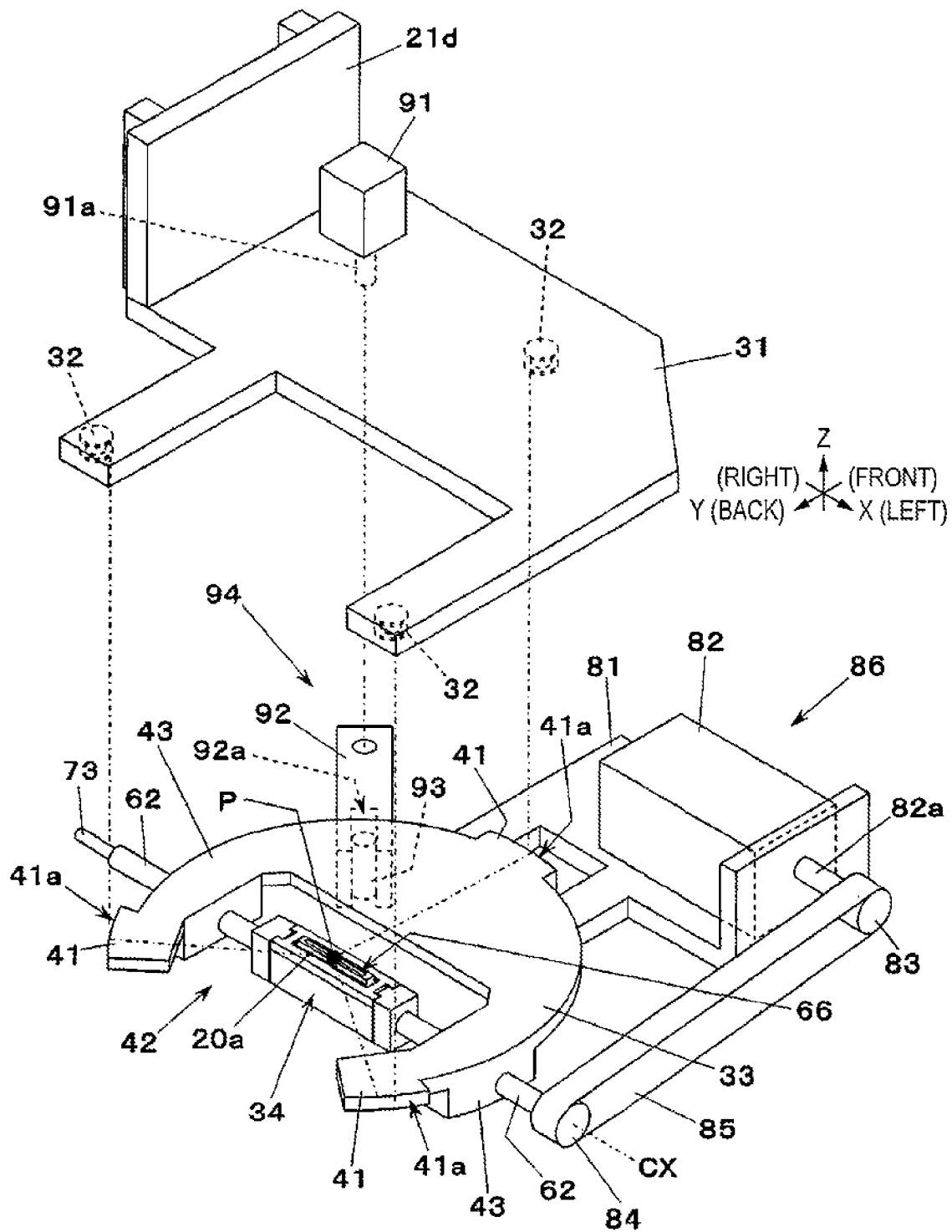
FIG. 4 is an exploded perspective view of the inverting head of the embodiment of the present invention.

In FIGS. 3 and 4, the nozzle holder support member 33 is made up of a member that is shaped, by and large, like a disc when viewed from above. Three tabs 41 are provided in some positions on an outer circumference of the nozzle holder support member 33. Arcuate peripheries 41a of the three tabs 41 form portions of an imaginary circle centered on a pivot P set in a center of the disc. The plurality of bearings 32 placed on an underside of the base 31 support, while remaining in contact with, the arcuate peripheries 41a of the three tabs 41 of the nozzle holder support member 33. The nozzle holder support member 33 is capable of swaying around the pivot P set in its center with respect to the base 31 within a horizontal plane.

Specifically, the nozzle holder support member 33 is configured so as to be swayable with respect to the base 31 within the horizontal plane while the arcuate peripheries 41a are supported by the plurality of bearings 32 provided on the base 31.

Figure 5:
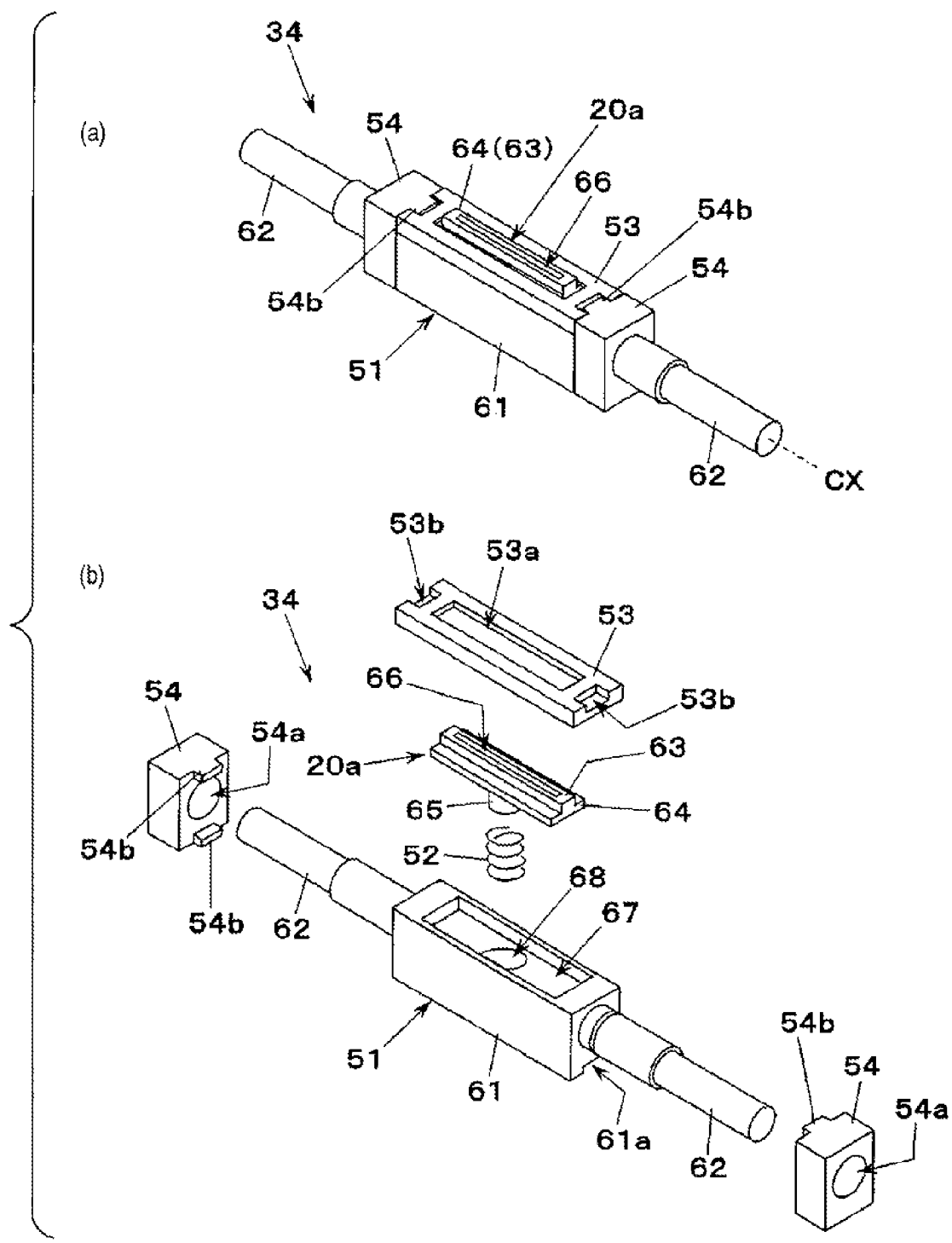
FIG. 5 is view in which (a) shows a perspective view of a nozzle holder that makes up the inverting head of the embodiment of the present invention, and (b) shows an exploded perspective view of the same.
Figure 6:
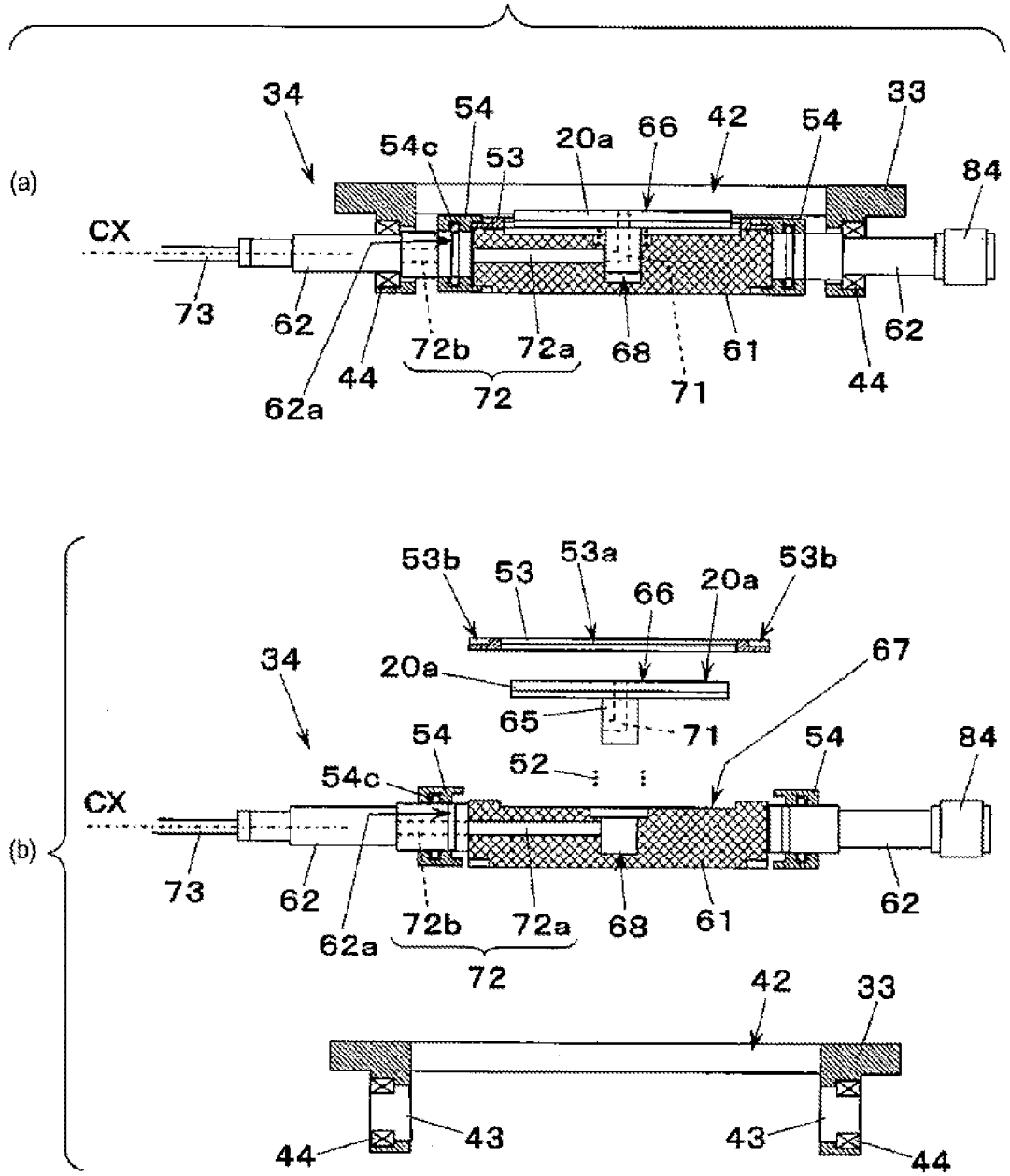
FIG. 6 is view in which (a) shows a side cross sectional view of the nozzle holder of the embodiment of the present invention, and (b) shows an exploded side cross sectional view of the same.

As shown in (a) and (b) in FIGS. 5 and (a) and (b) in FIG. 6, a cutout 42 is formed in a center region of the nozzle holder support member 33 that includes the pivot P. A pair of arms 43, extend in a direction of the horizontal plane from the nozzle holder support member 33 such that the cutout 42 is sandwiched between the arms. A pair of bearings 44 ((b) in FIG. 2) are accommodated in the pair of arms 43 on a one-on-one basis, and both ends of the nozzle holder 34 are supported in a horizontal position by means of the pair of bearings 44.

Specifically, the nozzle holder 34 is configured such that both ends of the nozzle holder 34 are supported by the nozzle holder support member 33; that the nozzle holder 34 extends so as to pass transversely, in the horizontal direction, across the inside of the cutout 42 belonging to the nozzle holder support member 33; the nozzle holder 34 is turnable around a horizontal axis CX; and that the nozzle 20a is held on a side surface of the nozzle holder 34.

In (a) and (b) in FIG. 5, the nozzle holder 34 includes a nozzle base 51 that extends in a horizontal direction and is rotatably supported at both ends by the pair of bearings 44 belonging to the nozzle holder support member 33, a compression spring member 52, a nozzle engagement member 53, and a pair of fixing members 54. Further, the nozzle base 51 has a base body 61 that extends in a horizontal direction and that assumes the shape of a rectangular parallelepiped and two cylindrical base body supports 62 that extend outwards from respective ends of the base body 61.

In (a) and (b) in FIG. 5, the nozzle 20a includes a nozzle body 64 that is formed into the shape of a horizontally-extended rectangular parallelepiped and that has a convex portion 63 which juts outside from the nozzle holder 34 and a cylindrical portion 65 that juts from the nozzle body 64, extending toward the inside of the nozzle holder 34. A slit-like component pickup port 66 is formed in the nozzle body 64. The nozzle engagement member 53 is formed from a rectangular member that assumes the shape of a horizontally-elongated flat plate, and has an opening 53a of a size which allows penetration of the convex portion 63 of the nozzle 20a.

In (b) in FIGS. 5 and 6, a rectangular indentation 67 and a cylindrical indentation 68 situated within the rectangular indentation 67 are provided in one side surface of the base body 61. The cylindrical portion 65 of the nozzle 20a is contained in the cylindrical indentation 68, and the nozzle body 64 is contained in the rectangular indentation 67 while the convex portion 63 of the nozzle 20a whose cylindrical portion 65 is fitted in the cylindrical indentation 68 is caused to pass through the opening 53a. Each of the fixing members 54 has in its center a through hole 54a that lets each end (the base body support 62) of the nozzle base 51 pass, and a pair of claws 54b are provided on upper and lower ends of the individual fixing member 54 such that the through hole 54a is sandwiched between the upper and lower ends.

The cylindrical portion 65 of the nozzle 20a around which the compression spring member 52 is fitted is contained in the cylindrical indentation 68. The nozzle engagement member 53 is attached to the base body 61 such that the convex portion 63 of the nozzle 20a penetrates through the nozzle engagement member 53 from its opening 53a. Subsequently, the fixing members 54 are slidably attached to both ends of the nozzle base 51 from the outside. The pair of claws 54b of the respective fixing members 54 are engaged with engagement recesses 53b ((b) in FIG. 5) formed in both ends of the nozzle engagement member 53 and engagement recesses 61a ((b) in FIG. 5) formed in both ends of the base body 61, whereupon the nozzle engagement member 53 and the nozzle base 51 are joined together. An O-ring 54c provided on an interior surface of the through hole 54a is engaged, at this time, with a groove 62a formed in the base body support 62, whereby the respective fixing members 54 are fixed to the nozzle base 51 (see (b) in FIG. 6→(a) in FIG. 6). Thus, the nozzle 20a becomes secured to the nozzle base 51 (see (a) in FIG. 5).

In (a) and (b) in FIG. 6, an intra-nozzle vacuum pathway 71 is formed within the nozzle 20a, wherein one end of the intra-nozzle vacuum pathway 71 is opened in the component pickup port 66, and the other end of the same is opened in a side surface of the cylindrical portion 65. Further, an intra-nozzle-base vacuum pathway 72 is formed in the nozzle base 51. The intra-nozzle-base vacuum pathway 72 is made up of an intra-nozzle-base first vacuum pathway 72a that is provided in the base body 61 and opened, at one end, in the cylindrical indentation 68, and an intra-nozzle-base second vacuum pathway 72b that is provided in one base body support 62 and that is joined to the intra-nozzle-base first vacuum pathway 72a.

In a state where the nozzle 20a is attached to the nozzle base 51, the intra-nozzle vacuum pathway 71 is in mutual communication with the intra-nozzle-base vacuum pathway 72 ((a) in FIG. 6). A vacuum pressure feed pipe 73 extending from an un-illustrated vacuum pressure feed apparatus is connected to one provided with the intra-nozzle-base second vacuum pathway 72b of the two base body supports 62 provided in the nozzle base 51 (i.e. the left-side base body support 62 shown in (a) and (b) in FIG. 6). Therefore, in a state where the nozzle 20a is attached to the nozzle base 51, the nozzle 20a is joined to the vacuum pressure feed pipe 73 by way of the intra-nozzle vacuum pathway 71 and the intra-nozzle-base vacuum pathway 72. A vacuum pressure is fed from the vacuum pressure feed apparatus to the vacuum pressure feed pipe 73, thereby generating a vacuum pressure in the intra-nozzle vacuum pathway 71, so that the nozzle 20a can pick up the component 4.

The nozzle holder 34 of the inverting head 20 provided in the component mounting apparatus 1 of the embodiment has the nozzle base 51, the nozzle engagement member 53, and the pair of fixing members 54. Namely both ends of the nozzle base 51 are supported so as to extend in the horizontal direction by the nozzle holder support member 33, and a vacuum pathway (the intra-nozzle-base vacuum pathway 72) is formed in the nozzle base 51. The nozzle engagement member 53 engages the nozzle 20a in the side surface of the nozzle base 51, thereby bringing the nozzle 20a (the intra-nozzle vacuum pathway 71) in mutual communication with the intra-nozzle-base vacuum pathway 72. The pair of fixing members 54 are slidably fitted to both ends of the nozzle base 51 from the outside, thereby fixing the nozzle engagement member 53 to the nozzle base 51. As mentioned above, the nozzle engagement member 53 is configured so as to be fixed to the nozzle base 51 by means of the pair of fixing members 54 that are attached to both ends of the nozzle base 51 from the outside. Therefore, screws are not required to attach the nozzle engagement section 53 to the nozzle base 51.

Figure 2:
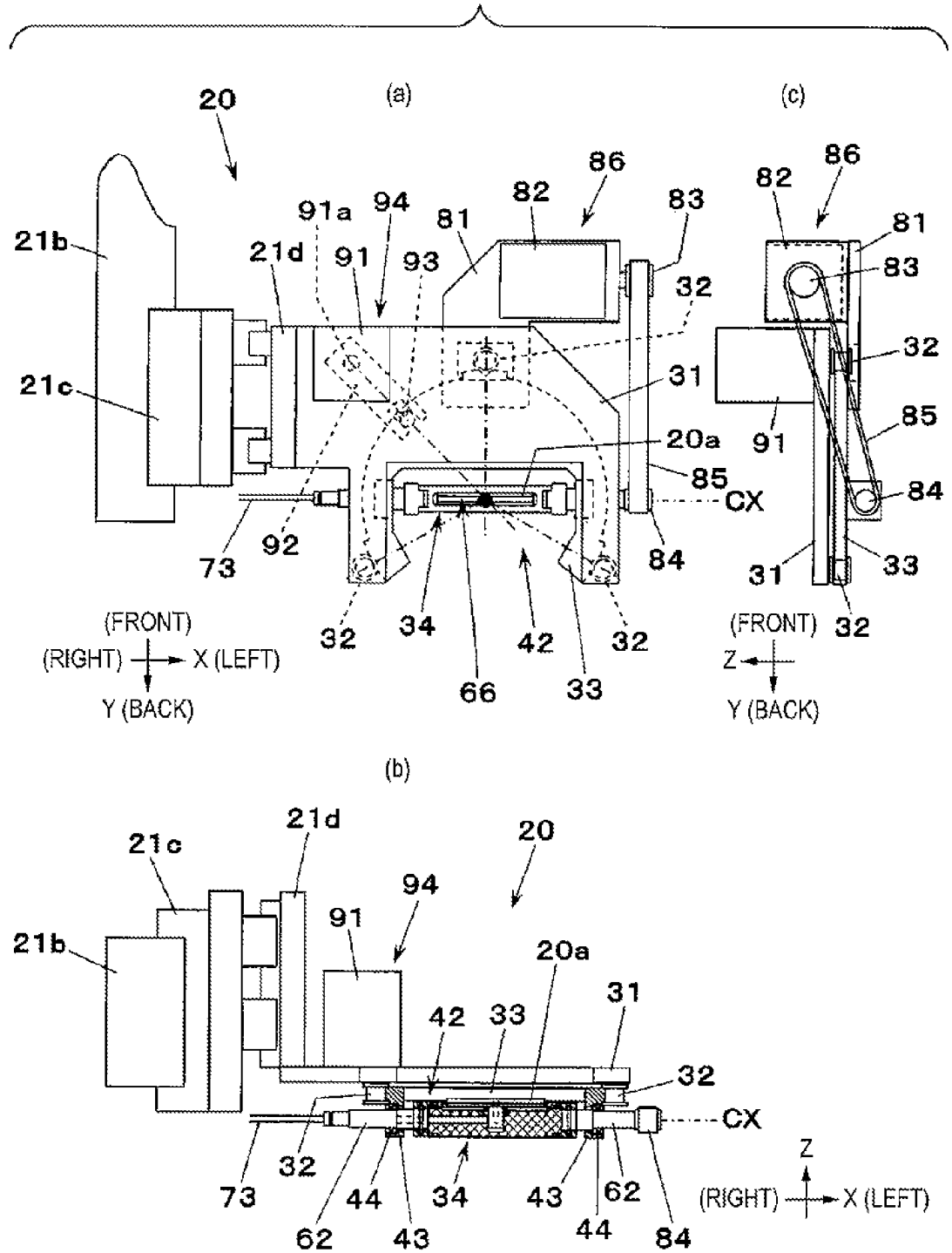
FIG. 2 is view in which (a) shows a plan view an inverting head of the embodiment of the present invention, (b) shows a front view of the same, and (c) shows a side view of the same.
Figure 7:
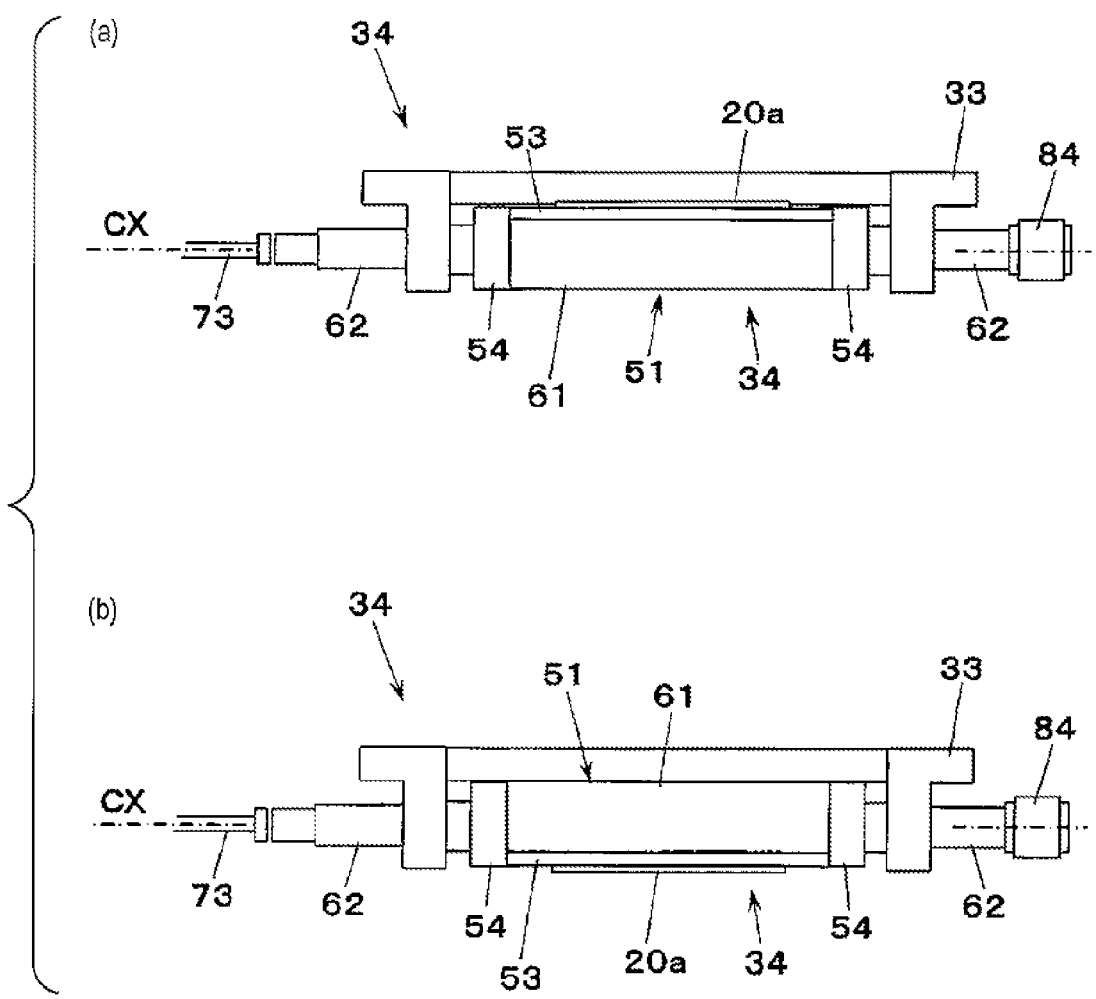
FIG. 7 is view in which (a) and (b) show side views of the nozzle holder of the embodiment of the present invention.

In (a) and (c) in FIG. 2, FIG. 3, and FIG. 4, a bracket 81 is provided in front of the nozzle holder support member 33 so as to extend forward. An inverter motor 82 is mounted on an upper surface of the bracket 81. A drive pulley 83 is attached to a drive shaft 82a of the inverter motor 82. Further, a driven pulley 84 is attached to the base body support 62 on one side of the nozzle holder 34 (i.e., a side opposite to the side of the nozzle holder 34 where the intra-nozzle-base second vacuum pathway 72b is provided). A driving belt 85 passes around the driven pulley 83 and the driven pulley 84. When the drive shaft 82a of the inverter motor 82 is rotated, the nozzle holder 34 turns around the horizontal axis CX by way of the drive pulley 83, the driving belt 85, and the driven pulley 84. The orientation of the nozzle 20a is thus turned upside down ((a) in FIG. 7→(b) in FIG. 7 or (b) in FIG. 7→(a) in FIG. 7).

As above, in the embodiment, a mechanism made up of the inverter motor 82, the driving pulley 83, the driven pulley 84, and the driving belt 85 serves as a rotary driving section 86 that inverts the orientation of the nozzle 20a upside down by turning the nozzles holder 34 around the horizontal axis CX.

In (a), (b) and (c) of FIG. 2, FIG. 3, and FIG. 4, a sway motor 91 is mounted on an upper surface of the base 31. A drive shaft 91a of the sway motor 91 extends downwardly while passing through the base 31 in its thickness direction. Attached to an extremity of the drive shaft 91a is one end of a sway drive arm 92 that is situated on the underside of the nozzle holder support member 33 and that extends in the horizontal direction. A vertically-extended groove 92a is formed in the other end of the sway drive arm 92. The groove 92a is engaged with a pin member 93 that extends downwards from the underside of the nozzle holder support member 33. Therefore, when the drive shaft 91a of the sway motor 91 is rotated, the sway drive arm 92 sways around the drive shaft 91*a*, whereby the nozzle holder support member 33 sways around the pivot P within the horizontal plane by way of the pin member 93 engaged with the groove 92*a* formed in the end of the sway drive arm 92 ((a) in FIG. 8→(b) in FIG. 8).

Figure 8:
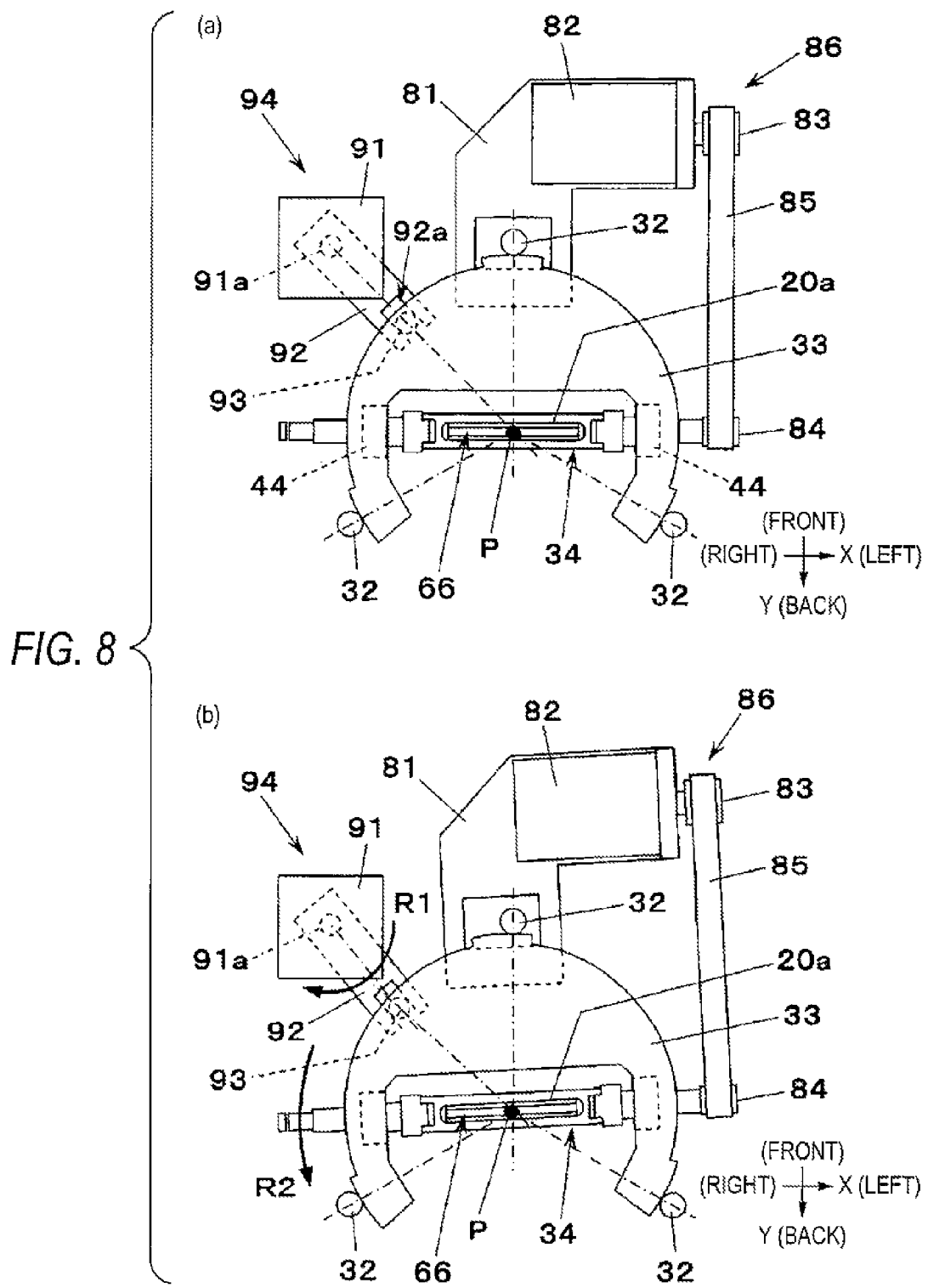
FIG. 8 is view in which (a) and (b) show plan views of the inverting head of the embodiment of the present invention.

The center position of the upwardly/downwardly-oriented nozzle 20*a* coincides with the sway center P of the nozzle holder support member 33 when viewed from above. The orientation of the upwardly/downwardly-oriented nozzle 20*a* achieved within the horizontal plane can be changed by swaying the nozzle holder support member 33 within the horizontal plane. (b) in FIG. 8 shows an example in which the sway motor 91 in a state shown in (a) in FIG. 8 is activated to sway the sway drive arm 92 in a clockwise direction (designated by arrow R1) when viewed from above, thereby swaying the nozzle holder support member 33 in a counterclockwise direction (designated by arrow R2) when viewed from above.

As above, in the embodiment, the sway motor 91, the sway drive arm 92, and the pin member 93 serve as a sway driving section 94 that sways the nozzle holder support member 33 with respect to the base 31 within the horizontal plane, thereby changing the orientation of the upwardly/downwardly-oriented nozzle 20*a* within the horizontal plane.

Figure 9:
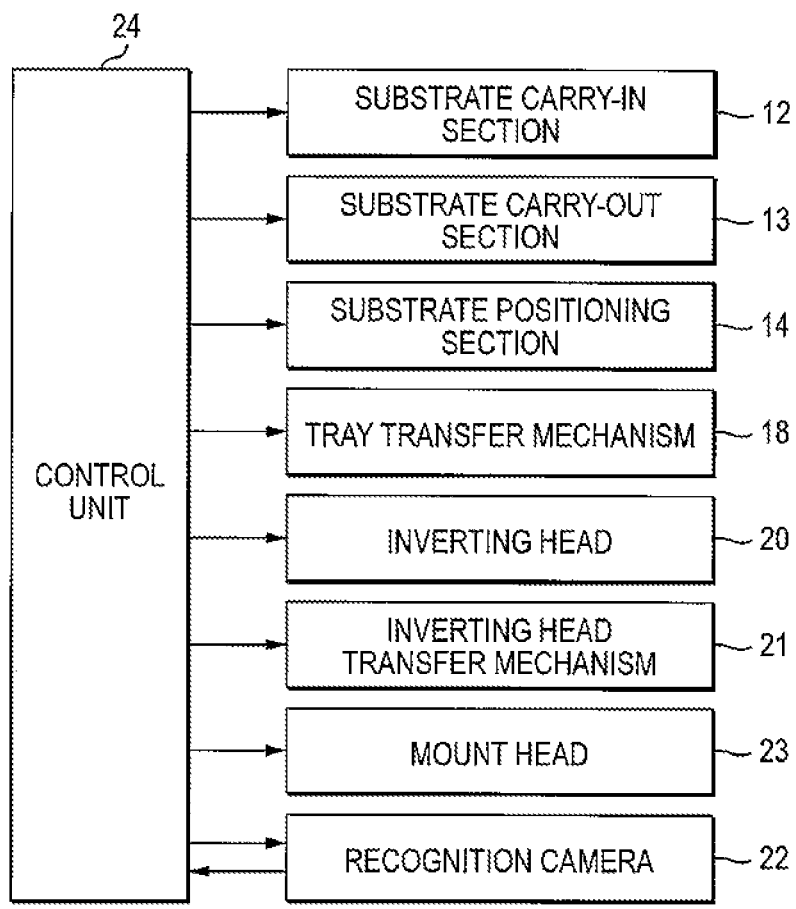
FIG. 9 is a block diagram showing a control system of the component mounting apparatus of the embodiment of the present invention.

In the component mounting apparatus 1 having such a configuration, the control unit 24 controls operation of the substrate carry-in section 12, the substrate carry-out section 13, the substrate positioning section 14, the tray transfer mechanism 18, the inverting head 20, the inverting head transfer mechanism 21, and the mount head 23. The control unit 24 also controls imaging operation of the recognition camera 22 and image recognition to be performed by the recognition camera 22 on the basis of image data (FIG. 9).

Upon detection of delivery of the substrate 2 to the substrate carry-in section 12 from another upstream apparatus contiguous to the component mounting apparatus 1 with respect to the process flow, the control unit 24 controls operation of the substrate carry-in section 12 and the substrate positioning section 14, thereby transferring the substrate 2 from the substrate carry-in section 12 to the substrate positioning section 14.

After transferring the substrate 2 from the substrate carry-in section 12 to the substrate positioning section 14, the control unit 24 transfers the substrate 2 within the horizontal plane by controlling operation of the substrate positioning section 14, thereby positioning the substrate 2 such that the rows of electrodes 3 aligned along one long side of the substrate 2 are situated at an elevated position over the backup stage 15 in alignment with the X-axis direction. The electrode 3 equivalent to the component mounting targeting location to which the component 4 is about to be mounted is situated at a point immediately below the mount head 23 where the component 4 are to be mounted.

After positioning the substrate 2, the control unit 24 controls operation of the tray transfer mechanism 18, thereby taking the tray TR out of the tray feed section 16 and positioning the thus-take-out tray TR at the component supplying position.

After positioning the tray TR to the component supplying position, the control unit 24 controls operation of the inverting head transfer mechanism 21, thereby transferring the inverting head 20 whose nozzle 20*a* remains inverted downwardly to an elevated position above the tray feed section 16. Operation of the inverting head transfer mechanism 21 is controlled to lower the transfer base 21*d*, thereby causing the nozzle 20*a* of the inverting head 20 to pick up, from above in a contacting manner, the component 4 on the tray TR fed to the component supplying position.

After the inverting head 20 has picked up the component 4 from the tray TR, the control unit 24 controls operation of the rotary driving section 86, thereby switching the orientation of the nozzle 20*a* from down to up to thus invert the component 4 upside down. The recognition camera 22 captures an image of the component 4 thus inverted upside down and recognizes an image, thereby detecting an amount of position away from a reference position of the center of the component 4 inverted upside down. Although the image of the component 4 is herein recognized while the component 4 is inverted upside down by means of the inverting head 20, the recognition camera 22 can also capture an image of the component 4 before the inverting head 20 picks up the component 4 from the tray TR positioned at the component supplying position by means of the tray transfer mechanism 18.

Figure 10:
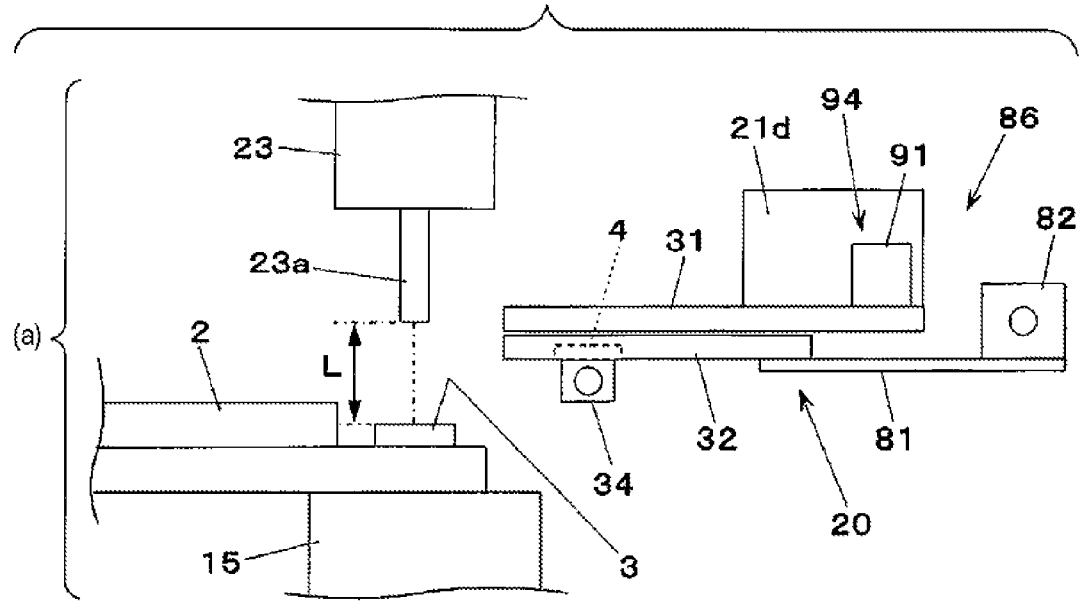
FIG. 10 is view in which (a) and (b) shows views showing how a component inverted upside down by the inverting head of the component mounting apparatus of the embodiment of the present invention is delivered to a mount head.
Figure 10:
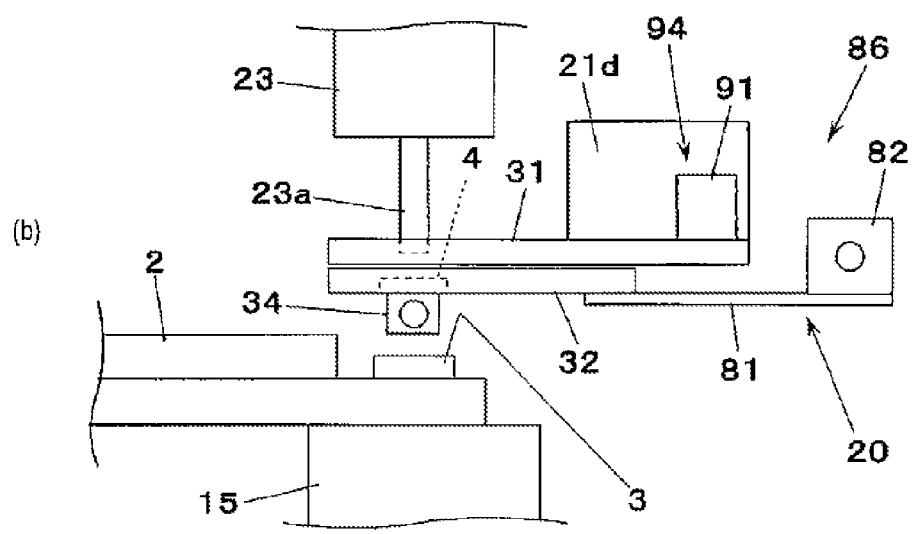

After detecting an amount of positional deviation from the reference position of the component 4 inverted upside down by the inverting head 20, the control unit 24 transfers the inverting head 20 such that the component 4 is situated at an elevated position above the electrode 3 (or the position below the mount head 23) that is the component mounting targeting location on the substrate 2 ((a) in FIG. 10→(b) in FIG. 10). A transfer position of the inverting head 20 is determined at this time such that the positional deviation of the component 4 with respect to the reference position of the electrode 3, which was detected by imaging action of the recognition camera 22, is cancelled. Further, operation of the sway driving section 94 is controlled to thereby change the orientation of the nozzle 20*a* in the horizontal plane in such a way that the nozzle 20*a* is directed to a normal orientation.

In the course of the inverting head 20 being transferred in such a way that the inverted component 4 comes to an elevated position above the electrode 3 (a position below the mount head 23), the inverting head 20 is in a state in which neither the mechanism for vertically moving the nozzle holder 34 (i.e., a mechanism for vertically moving the transfer base 21*d* in the embodiment) nor the mechanism for swaying the nozzle holder 34 around the vertical axis (i.e., the sway driving section 94) is present in regions above and below the nozzle holder 34; in other words, the regions above and below the nozzle holder 34 remain open. Therefore, a distance L ((a) in FIG. 10) between the substrate 2 and the mount head 23, which is necessary for the inverting head 20 to avoid interfering with the substrate 2 and the mount head 23 when the component 4 inverted upside down is moved to the elevated position above the electrode 3 (the component mounting targeting location) on the substrate 2, is approximately tantamount to the sum of the thickness of the nozzle holder 34 and appropriate clearance.

After the component 4 is moved to the elevated position above the electrode 3 that is the component mounting targeting location on the substrate 2, the control unit 24 controls operation of the inverting head transfer mechanism 21, thereby elevating the inverting head 20. Further, the control unit 24 brings the component 4 picked up by the nozzle 20*a* into contact with the component mount section 23*a* of the mount head 23 from below (or lowers the component mount section 23*a* of the mount head 23, thereby bringing the component mount section 23*a* into contact with the component 4 picked up by the nozzle 20*a* from above), thereupon handing the component 4 from the inverting head 20 to the mount head 23.

After the component 4 is passed from the inverting head 20 to the mount head 23, the control unit 24 controls operation of the inverting head transfer mechanism 21, to thus move the inverting head 20 in a forward direction, and lets the nozzle holder 34 leave a region between the substrate 2 and the mount head 23. After the nozzle holder 34 left the region between the substrate 2 and the mount head 23, the control unit 24 lowers the component mount section 23a of the mount head 23, thereby pressing and mounting, from above, the component 4 picked up by the component mount section 23a to the electrode 3 that is the component mounting targeting location on the substrate 2.

As above, in the component mounting apparatus 1 of the embodiment, the inverting head 20 has a function of picking up, from above, the component 4 fed to the component supplying position by means of the nozzle 20a and inverting the component 4 upside down and transferring the component 4 inverted upside down to an elevated position above the component mounting targeting location (the electrode 3) on the substrate 2 positioned by the substrate positioning section 14. The mount head 23 has a function of receiving from the inverting head 20 the component 4 transferred to the elevated position above the component mounting targeting location and lowering the component 4 after the inverting head 20 left the elevated position above the component mounting targeting location, to thus mount the component 4 to the component mounting targeting location.

After mounting the component 4 to the electrode 3 which is the component mounting targeting location on the substrate 2 in the manner as mentioned above, the control unit 24 elevates the component mount section 23a of the mount head 23 and transfers the substrate 2 such that the electrode 3, which is a new component mounting targeting location, is situated at a point (located below the mount head 23) where the component 4 is to be mounted. After the inverting head 20 picks up the next component 4, the component 4 is mounted to the electrode 3 that is the new component mounting targeting location.

After finishing mounting the component 4 on the electrodes 3 aligned along one long side, the control unit 24 controls operation of the substrate positioning section 14, thereby turning the substrate 2 through 90 degrees. Subsequently, the control unit 24 performs mounting the component 4 along similar procedures for the electrodes 3 aligned along one short side. After mounting the component 4 to the electrodes 3 aligned along the one short side is completed, operation of the substrate positioning section 14 is controlled, to thereby pass to the substrate carry-out section 13 the substrate 2 on which the component 4 have finished being mounted. Next, the control unit 24 controls operation of the substrate carry-out section 13, thereby carrying the substrate 2 to another downstream apparatus contiguous to the component mounting apparatus 1 along the process flow.

As described above, in the component mounting apparatus 1 of the embodiment, the inverting head 20 is made up of the flat-plate-like base 31 provided in the transfer base 21d that is a member capable of vertical movement, the nozzle holder support member 33 capable of swaying within the horizontal plane as a result of the plurality of bearings 32 provided on the base 31 supporting the arcuate peripheries 41a, and the nozzle holder 34 that is supported by the nozzle holder support member 33 so as to be turnable around the horizontal axis CX and that holds on its side surface the nozzle 20a. Since neither the mechanism for vertically moving the nozzle holder 34 nor the mechanism for swaying the nozzle holder 34 around the vertical axis is present in the regions above and below the nozzle holder 34, the regions above and below the nozzle holder 34 can be made open. Consequently, the distance L between the substrate 2 and the mount head 23 required for the inverting head 20 to avoid interfering with the substrate 2 and the mount head 23 when the component 4 inverted upside down is moved to an elevated position above the component mounting targeting location on the substrate 2 can be set to a small value. The down-stroke of the component 4 required when the mount head 23 mounts the component 4 to the substrate 2 is thereby made short, making the entire component mounting apparatus 1 compact and enhancing accuracy in mounting the component 4.

Furthermore, the inverting head 20 is configured such that the nozzle engagement member 53 which engages the nozzle 20a on the side surface of the nozzle base 51 to thus bring the vacuum pathway (the intra-nozzle-base vacuum pathway 72) formed in the nozzle 20a and the vacuum pathway formed in the nozzle base 51 into mutual communication with each other is fixed to the nozzle base 51 by means of the pair of fixing members 54 to be attached to both ends of the nozzle base 51 from the outside. Thus, since screws are not necessary to attach the nozzle engagement member 53 to the nozzle base 51, there is no necessity for taking into account a dimension which would otherwise be required to secure screws. Therefore, the height of the nozzle base 51 can be reduced correspondingly, and hence the distance L can be set to a much smaller value. Further, the down-stroke of the component 4 which is required when the mount head 23 mounts the component 4 to the substrate 2 is made shorter, whereby accuracy in mounting the component 4 can be enhanced to a much greater extent.

The patent application is based on Japanese Patent Application (JP-2011-244231) filed on Nov. 8, 2011, the subject matter of which is incorporated herein by reference in its entirety.

INDUSTRIAL APPLICABILITY

There is provided a component mounting apparatus that makes shorter a down-stroke of a component required when a mount head mounts a component on a substrate, to thus make an entirety of the component mounting apparatus smaller and allow enhancement of accuracy in mounting component.

DESCRIPTIONS OF THE REFERENCE NUMERALS AND SYMBOLS

1 COMPONENT MOUNTING APPARATUS
2 SUBSTRATE
3 ELECTRODE (COMPONENT MOUNTING TARGETING LOCATION)
4 COMPONENT
14 SUBSTRATE POSITIONING SECTION
20 INVERTING HEAD
20a NOZZLE
21d TRANSFER BASE (TRANSFER MEMBER)
23 MOUNT HEAD
31 BASE
32 BEARING
33 NOZZLE HOLDER SUPPORT MEMBER
34 NOZZLE HOLDER
41a ARCUATE PERIPHERY
51 NOZZLE BASE
53 NOZZLE ENGAGEMENT MEMBER
54 FIXING MEMBER
72 INTRA-NOZZLE-BASE VACUUM PATHWAY (VACUUM PATHWAY)
86 ROTARY DRIVING SECTION
94 SWAY DRIVING SECTION
CX HORIZONTAL AXIS

The invention claimed is:
1. A component mounting apparatus, comprising:
a substrate positioning section positioning a substrate;

an inverting head that picks up a component fed to a component supplying position from above by a nozzle, that inverts the component upside down, and that transfers the component inverted upside down to a position that is above a component mounting targeting location on the substrate positioned by the substrate positioning section; and a mount head that receives the component transferred to the position above the component mounting targeting location from the inverting head, and that lowers the component after the inverting head left the position above the component mounting targeting location, so as to mount the component to the component mounting targeting location;

wherein the inverting head includes a plate-shaped base provided on a vertically-movable transfer member;

a nozzle holder support member including an arcuate periphery supported by a plurality of bearings provided on the base and that is swayable within a horizontal plane with respect to the base, wherein the nozzle holder support member has a substantially circular plate shape, and wherein the nozzle holder support member is provided with a cutout in a central region of the nozzle holder support member, and a pair of arm parts sandwiching the cutout and extending in a horizontal plane;

a nozzle holder that extends in a horizontal direction with both ends of the nozzle holder being supported by the nozzle holder support member, that is turnable around a horizontal axis, and that holds the nozzle on a side surface of the nozzle holder;

a rotary driving section that turns the nozzle holder around the horizontal axis, so as to switch an orientation of the nozzle between up and down; and a sway driving section that sways the nozzle holder support member within the horizontal plane with respect to the base, so as to change the orientation of the upwardly/downwardly-oriented nozzle within the horizontal plane.

2. The component mounting apparatus according to claim 1, wherein the nozzle holder includes a nozzle base that is supported by the nozzle holder support member at both ends of the nozzle base, that extends in the horizontal direction, and that has a vacuum pathway formed in the nozzle base;

a nozzle engagement member that brings the vacuum pathway in the nozzle and the vacuum pathway in the nozzle base into mutual communication with each other by engaging the nozzle on the side surface of the nozzle base; and a pair of fixing members that are slidably attached to both ends of the nozzle base from outside, so as to fix the nozzle engagement member to the nozzle base.

\* \* \* \* \*